(12) United States Patent
Shibata et al.

(10) Patent No.: US 8,772,808 B2
(45) Date of Patent: Jul. 8, 2014

(54) SEMICONDUCTOR LIGHT EMITTING ELEMENT AND MANUFACTURING METHOD THEREOF

(75) Inventors: Yasuyuki Shibata, Tokyo (JP); Ji-Hao Liang, Tokyo (JP); Jiro Higashino, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/426,141

(22) Filed: Mar. 21, 2012

(65) Prior Publication Data

US 2012/0241805 A1 Sep. 27, 2012

(30) Foreign Application Priority Data

Mar. 22, 2011 (JP) ................... 2011-062099

(51) Int. Cl.
*H01L 33/00* (2010.01)
(52) U.S. Cl.
USPC .. 257/98; 257/99; 257/E33.067; 257/E33.068
(58) Field of Classification Search
None
See application file for complete search history.

(56) References Cited

U.S. PATENT DOCUMENTS

| | | | | |
|---|---|---|---|---|
| 5,972,731 A * | 10/1999 | Dutta | | 438/39 |
| 6,630,689 B2 * | 10/2003 | Bhat et al. | | 257/79 |
| 6,891,197 B2 * | 5/2005 | Bhat et al. | | 257/79 |
| 6,946,309 B2 * | 9/2005 | Camras et al. | | 438/26 |
| 7,294,864 B2 * | 11/2007 | Kim et al. | | 257/98 |
| 7,566,910 B2 * | 7/2009 | Kim et al. | | 257/98 |
| 7,588,998 B2 | 9/2009 | Fehrer et al. | | |
| 7,868,349 B2 * | 1/2011 | Kim et al. | | 257/100 |
| 8,053,797 B2 * | 11/2011 | Cheng et al. | | 257/98 |
| 8,513,679 B2 * | 8/2013 | Jeong et al. | | 257/79 |
| 2003/0205712 A1 * | 11/2003 | Bhat et al. | | 257/79 |
| 2005/0269588 A1 * | 12/2005 | Kim et al. | | 257/99 |
| 2008/0210963 A1 * | 9/2008 | Lin et al. | | 257/98 |
| 2011/0089452 A1 * | 4/2011 | Jeong et al. | | 257/98 |
| 2011/0108869 A1 * | 5/2011 | Hwang | | 257/98 |
| 2012/0086038 A1 * | 4/2012 | Hwang | | 257/98 |
| 2012/0119243 A1 * | 5/2012 | Kim et al. | | 257/98 |

FOREIGN PATENT DOCUMENTS

| | | |
|---|---|---|
| JP | 2000-228539 A | 8/2000 |
| JP | 2004-172351 A | 6/2004 |
| JP | 2005-516415 A | 6/2005 |
| WO | WO98/14986 A1 | 4/1998 |

* cited by examiner

*Primary Examiner* — Hoang-Quan Ho
(74) *Attorney, Agent, or Firm* — Holtz Holtz Goodman & Chick PC

(57) ABSTRACT

A manufacturing method of a semiconductor light emitting element, includes forming sacrifice portions within the width of street portions in a semiconductor laminated body, and performing wet etching to remove the sacrifice portions together with their neighboring portions, thereby removing etching residuals in the streets.

1 Claim, 8 Drawing Sheets

SEMICONDUCTOR LIGHT EMITTING ELEMENT AND MANUFACTURING METHOD THEREOF

BACKGROUND OF THE INVENTION

1. Field of the Invention

The present invention relates to a manufacturing method of a semiconductor light emitting element such as a light emitting diode (LED) and a laser diode (LD), and a semiconductor light emitting element manufactured by the same.

2. Description of the Related Art

Semiconductor light emitting elements such as LEDs and LDs each comprises a semiconductor laminated body formed of an n-type semiconductor layer, an active layer, and a p-type semiconductor layer that are laid one over another on a growth substrate of sapphire or the like, and electrodes for supplying to the active layer. Where the growth substrate has an insulation property, some areas of the semiconductor laminated body formed are etched using a method such as reactive ion etching until the n-type semiconductor layer is exposed, n-electrodes are formed on the n-type semiconductor layer, and p-electrodes are on the p-type semiconductor layer.

The choice for the growth substrate greatly affects the crystal quality of semiconductor layers especially in forming the semiconductor laminated body. Also, the conductivity, thermal conductivity, and light absorption coefficient of the substrate affect the electric, thermal, and optical properties of optical semiconductor elements, and hence a substrate on which semiconductor layers of good crystallinity can be grown does not necessarily satisfy all properties.

With respect to the above facts, LEDs or LDs of a so-called thin film structure have been proposed where the semiconductor laminated body being separated/removed from the growth substrate, electrodes are formed directly on the semiconductor laminated body that contributes to light emission (refer to, e.g., References 1 to 4 below). By the removal of the growth substrate, light absorption that occurs when light passes through the growth substrate is eliminated, and further the portion of light totally reflected at their interface due to the difference in refractive index between the semiconductor laminated body and the growth substrate can be reduced. Further, the use of a support substrate of higher thermal conductivity than the growth substrate that is bonded to the semiconductor laminated body improves the heat radiation property of semiconductor light emitting elements. A laser lift-off (LLO) method is used to remove a translucent growth substrate of sapphire or the like.

Reference 1: International Publication Pamphlet WO98/14986

Reference 2: Japanese translation of PCT international application publication No. 2005-516415

Reference 3: Japanese Patent Application Laid-Open Publication No. 2000-228539

Reference 4: Japanese Patent Application Laid-Open Publication No. 2004-172351

SUMMARY OF THE INVENTION

In a conventional manufacturing method of a semiconductor light emitting element using the LLO method, generally, after an n-type semiconductor layer of n-GaN or the like, an active layer, and a p-type semiconductor layer of p-GaN or the like are sequentially grown one over another on the sapphire substrate to form a semiconductor laminated body, p-electrodes are selectively formed on the p-type semiconductor layer. A support substrate of Si or the like is bonded to the p-electrode side of the semiconductor laminated body via a bonding film of eutectic material to sandwich the semiconductor laminated body between the support substrate and the sapphire substrate, and subsequently laser light is irradiated from the sapphire substrate side to remove the sapphire substrate from the support substrate. Then, a resist layer is patterned so as to expose portions of the n-type semiconductor layer where isolation trenches (also called streets hereinafter) for dividing the wafer into multiple semiconductor light emitting elements by dicing are to be formed, and street portions are formed by etching. Then, an insulating film of $SiO_2$ or the like is patterned to cover the end faces of the active layer exposed by etching, and n-electrodes are formed on the n-type semiconductor layer. Then, the wafer is diced along the streets to divide into multiple elements.

If the division of elements is performed on the wafer including the semiconductor laminated body by dicing, then the dicing of the semiconductor laminated body leads to the occurrence of damage in the end faces of the active layer, resulting in a leak. Accordingly, broader portions of the semiconductor laminated body need to be removed beforehand to form isolation trenches as described above so that the dicing blade does not touch the semiconductor laminated body. Herein, the to-be-diced broad areas of the semiconductor laminated body are called street portions, and the areas other than the street portions, which are not to be diced, are called element portions.

When the street portions are removed by a dry etching method using, e.g., reactive ion etching or a wet etching method, with either method, several problems occur as follows.

FIG. 8A is a cross-sectional view showing part 1 of semiconductor light emitting element portions on the sapphire substrate when the street portions have been removed by a dry etching method. If a semiconductor laminated body 2 is etched by a dry etching method, it is difficult to finish the etching exactly when a semiconductor layer has been etched through, and usually a metal layer 3 (a cap layer) under the semiconductor layer (p-type semiconductor layer) is also etched. If the metal layer is also etched, metal particles from the metal layer 3 dry etched may bond to end faces of the active layer of the semiconductor laminated body 2, resulting in a leak.

FIG. 8B is a cross-sectional view showing part 1 of semiconductor light emitting element portions on the sapphire substrate when the street portions have been removed by a wet etching method. After the sapphire substrate is removed for the aforementioned thin film structure by wet etching, an N-plane of GaN or the like is exposed and hence can be easily wet etched with a KOH (potassium hydroxide) solution. However, the inventors found through earnest examination that where street portions are formed by wet etching, if there are areas having many defects in an exposed portion of the semiconductor laminated body 2, they are not completely etched away, resulting in wet etching residuals 5 remaining in the street and touching an end of the active layer of the semiconductor laminated body 2, and further that when being diced, the semiconductor laminated body 2 may be damaged, resulting in the occurrence of a leak.

The present invention has been made in view of the above facts, and an object thereof is to provide a manufacturing method of a semiconductor light emitting element which can prevent residuals of metal material or the like from bonding to the active layer and the occurrence of etching residuals from the semiconductor laminated body when the street portions are formed by etching, and the semiconductor light emitting element.

In order to solve the above task, according to the present invention, there is provided a manufacturing method of a semiconductor light emitting element, including forming sacrifice portions within the width of street portions in a semiconductor laminated body, and performing wet etching to remove at least the sacrifice portions, thereby completely removing etching residuals and the like remaining in the streets. That is, the manufacturing method of a semiconductor light emitting element of the present invention includes the steps of forming a semiconductor laminated body including an active layer on a surface of a growth substrate; forming a plurality of electrodes on the semiconductor laminated body; forming sacrifice portions separated from the plurality of electrodes via separation grooves on the semiconductor laminated body; forming a cap layer over the plurality of electrodes and the sacrifice portions to fill the separation grooves; bonding a support substrate to the cap layer via a bonding layer; irradiating laser light onto the semiconductor laminated body from the back side of the growth substrate, thereby separating the growth substrate from the semiconductor laminated body; etching the semiconductor laminated body, thereby forming isolation trenches to expose the sacrifice portions; and removing at least the sacrifice portions by wet etching.

In the above manufacturing method of a semiconductor light emitting element of the present invention, the plurality of electrodes and the sacrifice portions are formed of the same material, and the step of forming the plurality of electrodes and the step of forming the sacrifice portions are performed by providing a metal film on the semiconductor laminated body and forming the separation grooves in the metal film to divide into the plurality of electrodes and the sacrifice portions. By this means, the production process can be simplified.

A semiconductor light emitting element of the present invention comprises a semiconductor laminated body including an active layer; an electrode formed on the semiconductor laminated body to supply a current to the active layer; a cap layer formed over the semiconductor laminated body and the electrode; a bonding layer formed over the cap layer; and a support substrate to support the semiconductor laminated body via the bonding layer. The cap layer is formed of a multilayered film and has a wave-like bend around the electrode. By this means, the electrode and the cap layer can be prevented from peeling off.

According to the manufacturing method of a semiconductor light emitting element of the present invention, residuals of metal material or the like bonding to the active layer and the occurrence of etching residuals from the semiconductor laminated body can be prevented when the street portions are formed in the semiconductor laminated body by etching.

BRIEF DESCRIPTION OF THE DRAWINGS

The aforementioned aspects and other features of the present invention are explained in the following description, taken in connection with the accompanying drawing figures wherein.

DETAILED DESCRIPTION OF THE INVENTION

An embodiment of the present invention will be described below with reference to the accompanying drawings.

Figure 1:
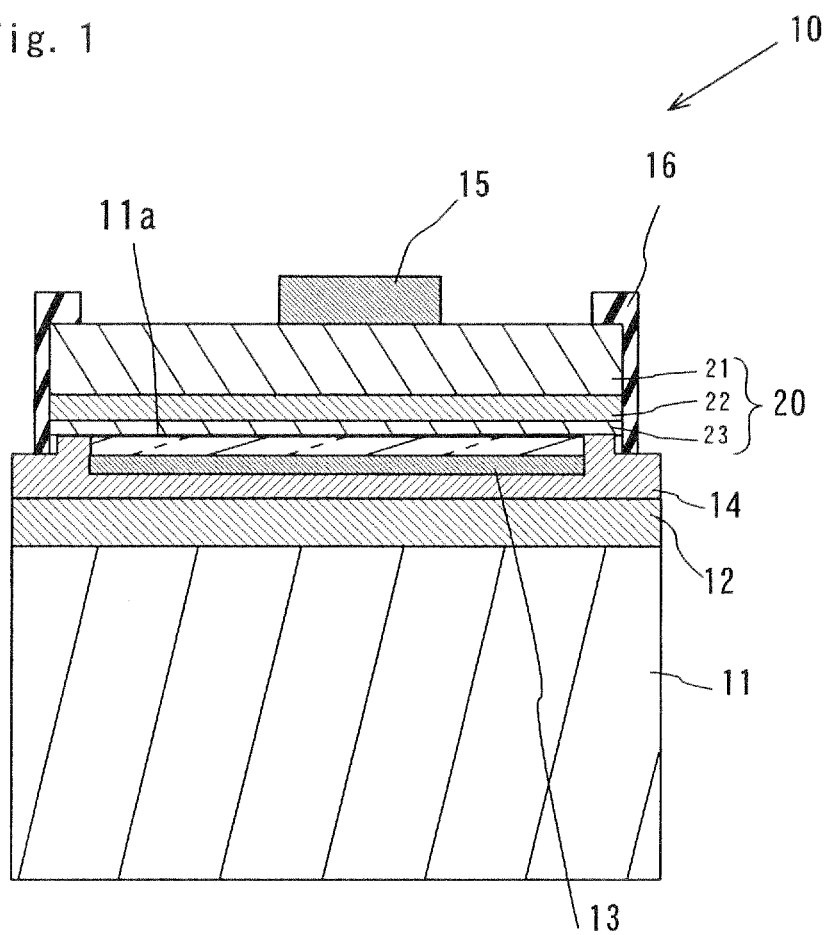
FIG. 1 is a schematic cross-sectional view of a semiconductor light emitting element obtained by the semiconductor light emitting element manufacturing method of the present embodiment.

As shown in FIG. 1, a semiconductor light emitting element 10 comprises a support substrate 11, a bonding layer 12, a p-electrode 13, a cap layer 14, an n-electrode 15, a protective layer 16, and a semiconductor laminated body 20. The semiconductor laminated body 20 is a multilayered film of GaN-based semiconductor single-crystal layers expressed by a general formula $Al_xIn_yGa_zN$ (where $0 \le x \le 1$, $0 \le y \le 1$, $0 \le z \le 1$, $x+y+z=1$) and each is epitaxial grown with, e.g., metal organic gases and so on as materials by a MOCVD (metal organic chemical vapor deposition) method or the like. The semiconductor laminated body 20 comprises an n-type semiconductor layer 21, an active layer 22, and a p-type semiconductor layer 23 laid one over another sequentially in the direction from the n-electrode 15 to the p-electrode 13. The n-type semiconductor layer 21 comprises a GaN underlying layer, an n-contact layer and an n-clad layer that are doped with an n-type impurity and the like (none of them shown). Examples of the n-type impurity include Si, Ge, and Sn, but are not limited thereto. The active layer 22 may take on any of a double hetero, a single quantum well, and a multi quantum well structure (not shown). The p-type semiconductor layer 23 comprises a p-clad layer and a p-contact layer that are doped with a p-type impurity and the like (none of them shown). Examples of the p-type impurity of the p-clad layer and p-contact layer include Mg, but are not limited thereto. The growth method of the semiconductor laminated body 20 is not limited to a specific one, but the nitride semiconductors can be epitaxial grown by an HVPE (hydride vapor phase epitaxy) method or an MBE (molecular beam epitaxy) method instead of MOCVD.

The support substrate 11 is a semiconductor substrate made of Si or the like. The bonding layer 12 is formed of metals and an alloy, i.e., Pt, Ti, Ni, Au, and AuSn.

The p-electrode 13 is formed on the p-type semiconductor layer 23. Then-electrode 15 is formed on the n-type semiconductor layer 21 in the middle. A single-layered film, a laminated film, or an alloy including any of Pt, Ru, Os, Rh, Ir, Pd, Ag, Ti, Au, Ni, and the like can be used for materials of the p-electrode 13 and the n-electrode 15. An ITO (indium tin oxide) layer 11a is provided between the p-electrode 13 and the p-type semiconductor layer 23.

The cap layer 14 is provided to flatten the p-electrode side and suppress migration.

The protective layer 16 is an insulating film made of silicon dioxide ($SiO_2$) or the like to prevent short-circuiting. The protective layer 16 is formed surrounding the n-electrode 15 to cover the end faces of the active layer 22 of the semiconductor laminated body 20 on the surface of the p-type semiconductor layer 23.

Next, the manufacturing method of a semiconductor light emitting element of this embodiment will be described.

First, a sapphire substrate is prepared as a growth substrate 30 on which semiconductor layers are to be formed.

Figure 2A:
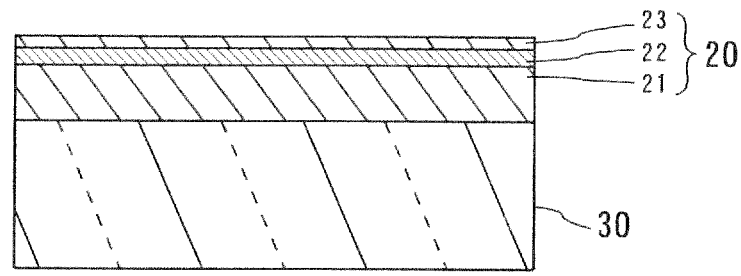
FIGS. 2A-2C, 3A-3C, 4A-4C, 5A-5C and 6A-6C are schematic cross-sectional views each showing a substrate for explaining the production steps in the semiconductor light emitting element manufacturing method of the embodiment.

As shown in FIG. 2A, the n-type semiconductor layer 21, the active layer 22, and the p-type semiconductor layer 23 are sequentially grown on the growth substrate 30 using an MOCVD apparatus to form the semiconductor laminated body 20 composed of GaN-based single-crystals.

Figure 2B:
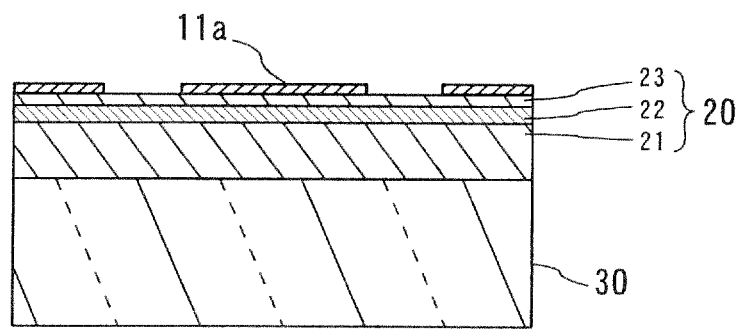

As shown in FIG. 2B, the pattern features of the ITO (indium tin oxide) layer 11a are formed over portions corresponding to the p-electrodes described later of the surface of the p-type semiconductor layer 23 of the semiconductor laminated body 20 by photolithography, etc., so that the p-electrodes form ohmic contact with the p-type semiconductor layer. Since in the subsequent step the p-electrodes are to be provided corresponding to individual semiconductor light emitting elements to be obtained finally, the ITO layer 11a is also patterned to be divided by lattice-like spaces into rectangular features so as to correspond to the semiconductor light emitting elements. After the pattering of the ITO layer 11a, heat treatment is performed for ohmic contact.

Figure 2C:
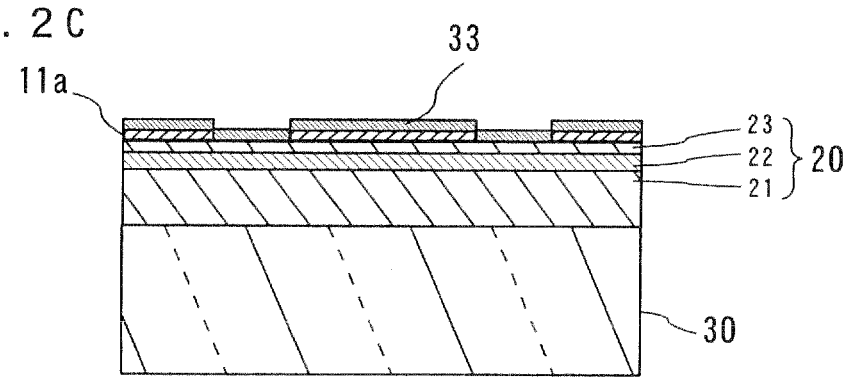

As shown in FIG. 2C, an Ag film 33 is formed entirely over the surface of the p-type semiconductor layer 23 of the semiconductor laminated body 20 on which the ITO layer 11a is formed.

Figure 3A:
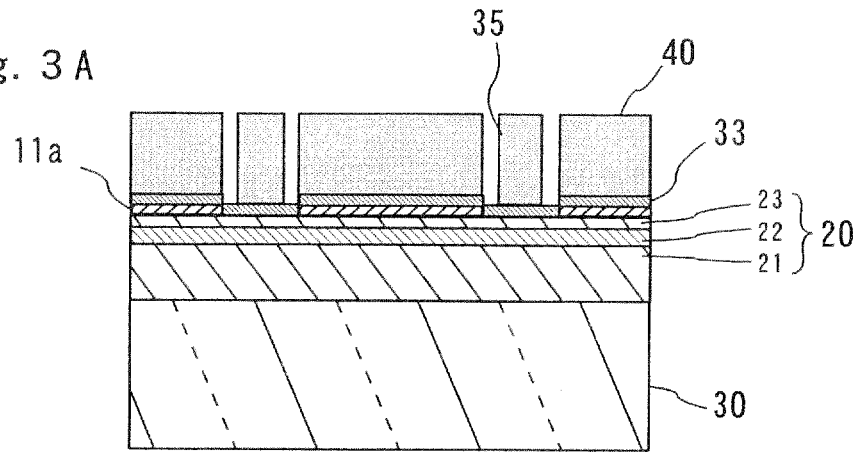

Then, as shown in FIG. 3A, a resist layer 40 is patterned to have a pair of parallel groove openings 35 on the Ag film 33 for division into multiple element portions (e.g., like a lattice). The openings 35 are formed such that pluralities of pairs of grooves with a narrow interval are arranged at broader intervals. Each pair of openings 35 is for separating adjacent p-electrodes, and patterning has been performed such that a pair of groove openings 35 is located in each of the intervals at which the features of the ITO layer 11a are formed in a lattice-like arrangement.

Then, with the resist layer 40 as a mask, the Ag film 33 is etched with an etchant with proportions of phosphoric acid: acetic acid:nitric acid:water=10:8:1:1 at 27° C. for eight seconds.

Figure 3B:
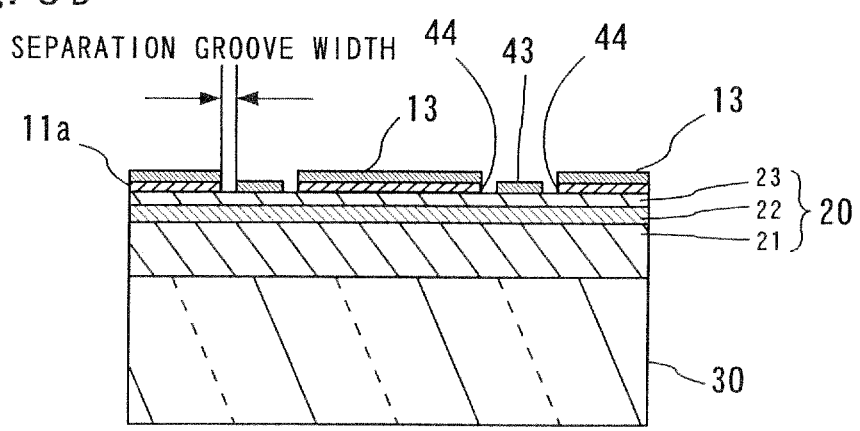

By this wet etching, as shown in FIG. 3B, separation grooves 44 are formed in positions that reflect the positions of the openings 35 of the resist layer 40. Portions of the Ag film located between a pair of separation grooves 44 with a narrow interval become sacrifice portions 43 [a sacrifice portion forming step], and portions sandwiched between different pairs of separation grooves become p-electrodes 13 made of Ag [a p-electrode forming step]. The p-electrodes 13 are provided on the ITO. Since the separation grooves 44 are provided in a lattice-like arrangement as the openings 35 are, the p-electrodes 13 are formed in a rectangular shape.

Although in this embodiment the electrodes 13 are provided on the ITO film 11a, but not being limited to this, the p-electrodes 13 may be provided directly on the surface of the p-type semiconductor layer 23. The process of forming the Ag film 33 and then patterning it into the p-electrodes 13 and the sacrifice portions 43 does not change except that the step of providing the ITO film 11a is eliminated. In this case, the p-electrodes provided, without changing either, are a rectangle surrounded by the openings 35, and the sacrifice portions 43 are provided between the p-electrodes and separated by the openings 35. Heat treatment to form ohmic contact is performed after the p-electrode forming step.

The positions of the sacrifice portions 43 coincide with cutting positions in a divide-into-chips step described later. Hence, where the wafer is divided into chips by dicing, the width of the sacrifice portions 43 need to be broader than the thickness of the dicing blade.

Figure 3C:
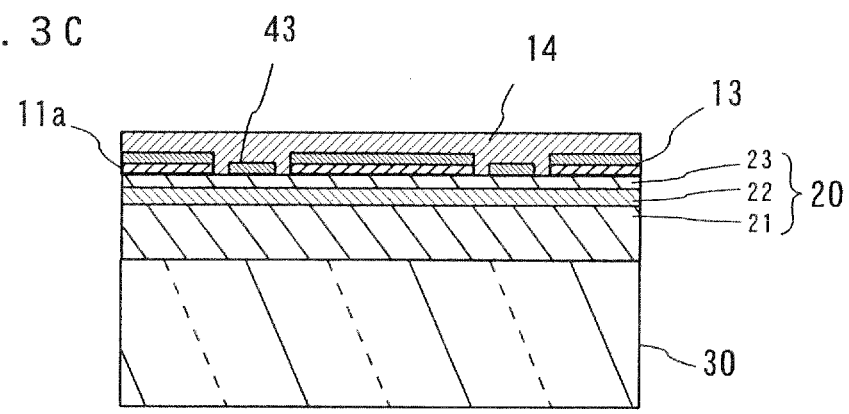

Then, as shown in FIG. 3C, the cap layer 14 that is a multilayered film is formed to cover the sacrifice portions 43 and the p-electrodes 13 of Ag on the p-type semiconductor layer 23 and fill the separation grooves 44. Ti (100 nm thickness), Pt (100 nm thickness), Ti (200 nm thickness), Pt (200 nm thickness), and Au (200 nm thickness) are sequentially deposited by, e.g., electron beam evaporation.

The separation grooves between the sacrifice portions 43 and the p-electrodes 13 need to be 1 μm to 30 μm in width so as to be filled with part of the cap layer 14. If the width of the separation grooves is smaller than or equal to that, part of the cap layer filling the separation groove does not have enough width to suppress migration of Ag that is p-electrode material. If the width of the separation grooves is greater than or equal to 30 μm, the p-electrode 13 of Ag of the element portions is reduced in area, resulting in a decrease in overall reflectivity and thus a reduction in light output.

Figure 4:
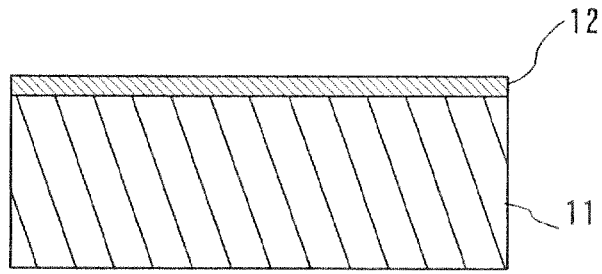
Figure 4:
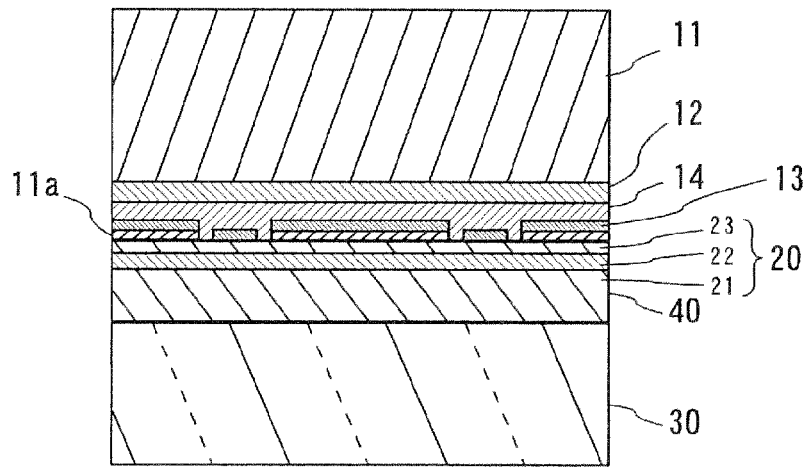
Figure 4:
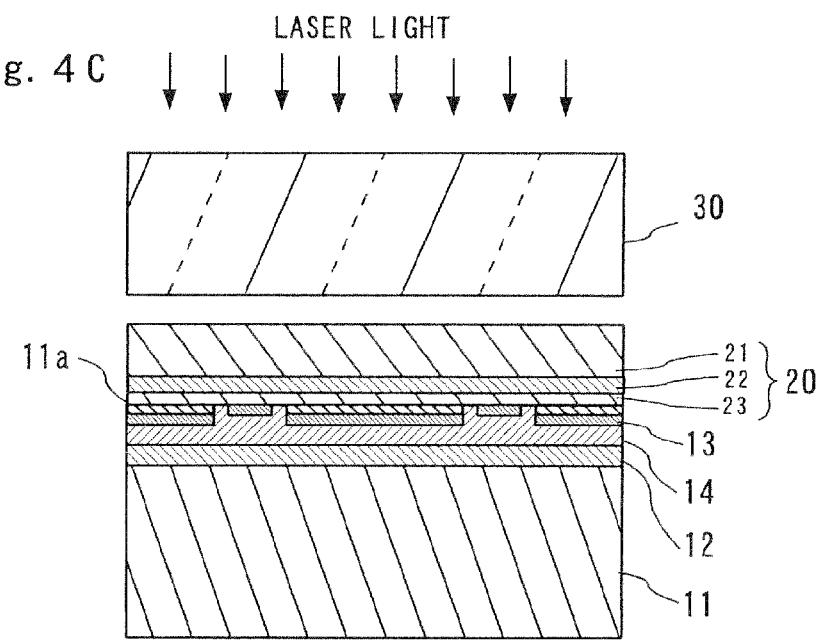

Then, as shown in FIG. 4A, the support substrate of a Si single crystal or the like on which a bonding layer 12 of a eutectic material is formed to support the semiconductor laminated body is prepared. Pt, Ti, Ni, Au, and AuSn are deposited in that order on the support substrate 11 by, e.g., a vacuum evaporation method to form the bonding layer 12.

Then, as shown in FIG. 4B, the wafer having undergone the above process is bonded to the support substrate having the eutectic material film formed thereon via the bonding layer 12 (a wafer bonding step). The bonding layer 12 formed on the support substrate 11 and the cap layer 14 formed on the p-electrodes 13 of the semiconductor laminated body 20 are put in close contact and thermally compression bonded in a vacuum or an $N_2$ atmosphere, thereby bonding the support substrate 11 to the p-type semiconductor layer 23 of the semiconductor laminated body 20 to be integrated with the growth substrate 30. Note that the support substrate 11 may be one formed by plating and growing a metal film made of Cu or the like on the cap layer 14.

Then, as shown in FIG. 4C, the growth substrate 30 is separated from the n-type semiconductor layer 21 of the semiconductor laminated body 20 by an LLO method where laser light is irradiated over the entire wafer from the back side of the growth substrate 30. A KrF excimer laser, an ArF excimer laser, and an Nd:YAG laser can be cited as a laser light source. In the LLO method, laser light passes through the sapphire growth substrate 30 and is absorbed by GaN forming the n-type semiconductor layer 21 of the semiconductor laminated body 20, so that part of a GaN buffer layer adjacent to the interface with the sapphire substrate 30 is decomposed into metal Ga and $N_2$ gas. By this means, the growth substrate 30 is separated from the semiconductor laminated body 20 at laser light irradiated portions. Subsequently, as needed, polishing or etching may be performed on the exposed surface after separation of the GaN layer of the n-type semiconductor layer 21 of the semiconductor laminated body 20.

Figure 5A:
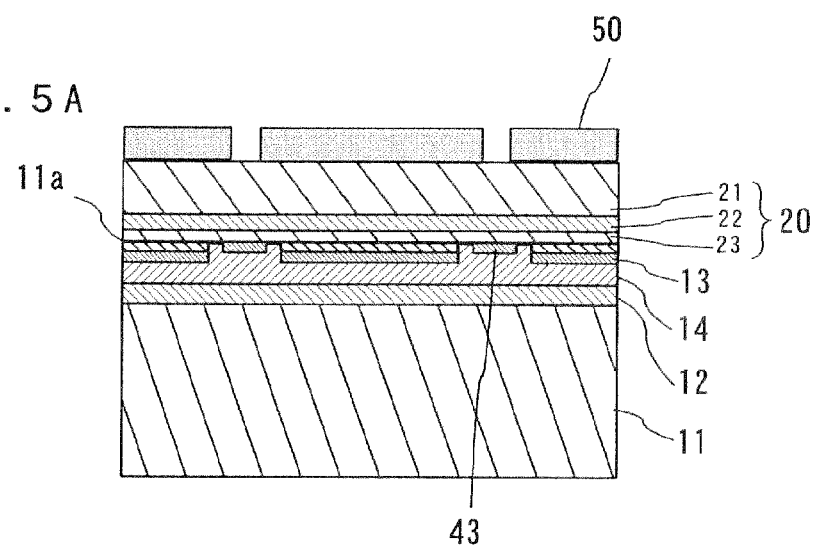

Then, the streets that separate the individual semiconductor light emitting elements are formed in the semiconductor laminated body 20. First, a resist layer 50 is coated on the surface of the n-type semiconductor layer 21 of the semiconductor laminated body 20. Subsequently, the resist layer 50 is patterned by photolithography such that openings are formed in a lattice-like arrangement on the other surface of the n-type semiconductor layer 21 from the sacrifice portions 43 at positions opposite them as shown in FIG. 5A and that the width of the lattice-like openings of the resist layer 50 is smaller than that of the sacrifice portions 43.

Figure 5B:
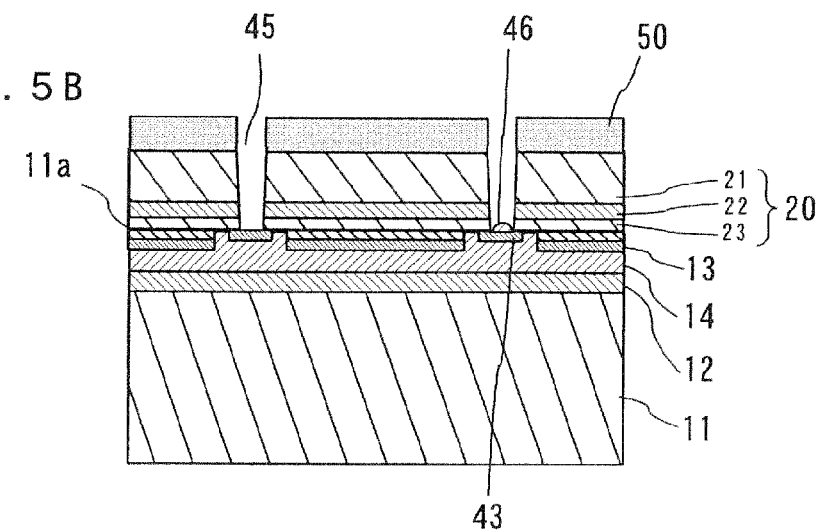

Then, with the resist layer 50 as a mask, the wafer is etched. As shown in FIG. 5B, only the street portions of the n-type semiconductor layer 21 are exposed through the openings of the resist layer 50. Then, the street portions exposed are etched. First, the semiconductor laminated body 20 is etched down to such a depth that the sacrifice portions 43 are not exposed by dry etching. Then, the etching is switched to wet etching where the wafer is put in contact with a KOH aqueous solution of 70° C., and the etching is performed until the sacrifice portions 43 is exposed. By this means, lattice-like streets 45 (isolation trenches) that reach the sacrifice portions 43 are formed in the n-type semiconductor layer 21 of the semiconductor laminated body 20. The semiconductor laminated body 20 is divided into rectangular element areas by the streets 45, and multiple element portions of the semiconductor laminated body 20 are defined. The width of the openings of the resist layer 50 is determined according to the width of the streets 45 to be formed. The width of the streets 45 is set such that the exposed surface when the etching has reached the sacrifice portion 43 lies over and within the upper surface of the sacrifice portion 43. Since the width on the sacrifice portion 43 side of the street 45 is smaller than the width of the openings of the resist layer 50, by patterning such that the width of the openings of the resist layer 50 is smaller than the width of the sacrifice portions 43, the cap layer 14 and the p-electrodes 13 can be more reliably prevented from being exposed.

Here, wet etching residuals 46 from the semiconductor laminated body 20 remain on the sacrifice portions 43 exposed through the streets as shown in FIG. 5B.

This street formation need not be performed all by wet etching, but dry etching may be used until halfway. Not being completely removed by wet etching, wet etching residuals may exist in the street, and metal particles may remain upon dry etching.

Figure 5C:
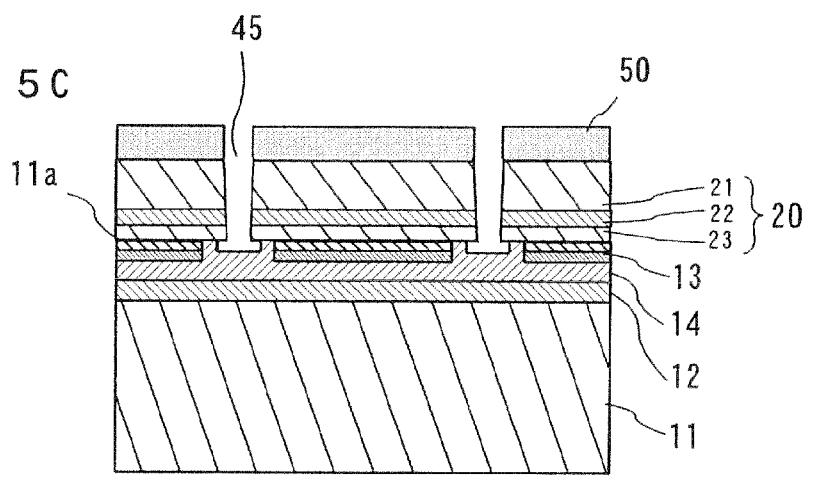

With the above resist layer 50 as a mask, a second etching is performed on the wafer to remove the sacrifice portions 43. The sacrifice portions 43 of Ag exposed through the isolation trenches (streets) of elements in the previous etching step are put in contact with a mixed solution with proportions of phosphoric acid:acetic acid:nitric acid:water=10:8:1:1 to be dissolved and removed. As shown in FIG. 5C, by etching the sacrifice portions of Ag, etching residuals and metal particles thereon together with them can be removed.

Although in this embodiment the streets are formed by dry etching and wet etching, they may be formed by only dry etching. In this case, because dry etching is performed until the sacrifice portions 43 is exposed, part of the sacrifice portions 43 may change into metal particles, which bond to the semiconductor laminated body 20, but their remaining will not pose a problem. This is because metal particles can also be removed together with the sacrifice portions 43 in the second etching step for the removal of the sacrifice portions. Also in the case of using dry etching, in order to prevent metal particles from originating from the cap layer, the width of the openings of the resist layer 50 is adjusted such that the exposed surface through the street lies over and within the sacrifice portion 43. Or, the streets may be formed by only wet etching. Also in this case, etching residuals 46 will remain on the sacrifice portions 43, but they can be removed together with the sacrifice portions 43 as in the case of using both dry etching and wet etching. However, in the case of using only wet etching, since the resist will not hold until the streets are formed, a metal mask should be used for the mask.

Although in this embodiment the sacrifice portions are formed of Ag, but not being limited to this, a material for which the etchant does not affect the cap layer can be used preferably. Thus, the cap layer and the p-electrodes covered by the cap layer remaining the same as they have been when formed, only the sacrifice portions 43 can be removed. Further, the sacrifice portions 43 are preferably made of a heat resistant material enduring heat at bonding.

Although in this embodiment the sacrifice portions and the p-electrodes are provided by forming the separation grooves in the Ag film, but not being limited to this, they may be formed separately. Thus, the p-electrodes and the sacrifice portions can be formed of different materials. In this case, the sacrifice portions may be made of $SiO_2$ or the like, for example, but not being limited to a conductive material. But, if the p-electrodes and the sacrifice portions are the same in material as in this embodiment, it is preferable that they be formed at the same time, in terms of simplifying the production process.

Figure 6A:
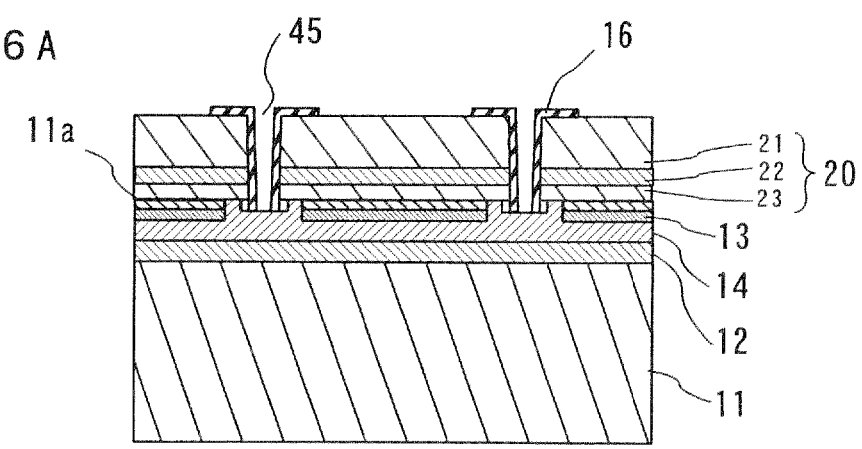

Then, as shown in FIG. 6A, the protective layer 16 is formed extending from the bottom and side wall of the streets 45 to the upper surface end of the n-type semiconductor layer 21 of the semiconductor laminated body 20 to cover the active layer 22 by the sputtering of $SiO_2$ or the like using a resist mask (not shown).

Figure 6B:
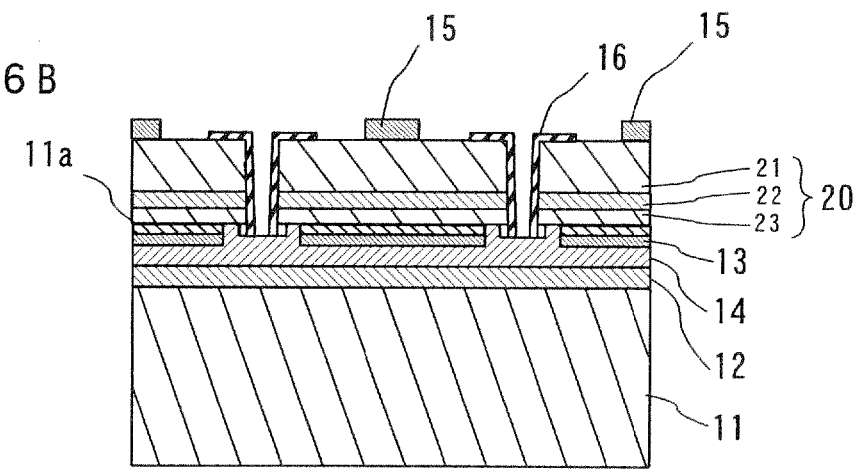

Then, as shown in FIG. 6B, the n-electrodes 15 are formed on the surface of the n-type semiconductor layer 21 of the semiconductor laminated body 20 by patterning. For example, Ti (1 nm thickness), Al (200 nm thickness), Ti (100 nm thickness), Pt (200 nm thickness), and Au (200 nm thickness) are sequentially deposited by, e.g., electron beam evaporation using a resist mask (not shown). Since the exposed surface of the n-type semiconductor layer 21 is a light emission surface, the n-electrodes 15 are formed to have a minimum area required for wire bonding when the semiconductor light emitting element is mounted.

Figure 6C:
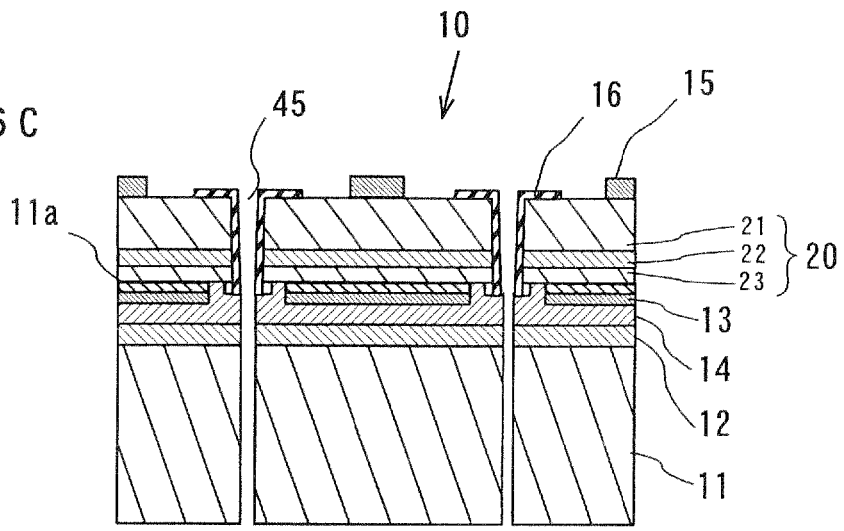

Then, as shown in FIG. 6C, the support substrate 11 is cut along the bottoms of the streets 45 by a dicing blade (not shown), so that the wafer having undergone the above process is divided into chips on a per semiconductor laminated body 20 basis or on a per group of several semiconductor laminated bodies 20 basis. Point scribe/breaking, laser scribe, or the like can be used as the method of dividing into chips, but not being limited to the dicing.

Having undergone the above process steps, the semiconductor light emitting element 10 of this embodiment is finished.

As obvious from the above description, according to the manufacturing method of a semiconductor light emitting element in accordance with the present embodiment, in the second etching step, etching residuals in the streets are removed together with material under them, and thereby semiconductor light emitting elements having less occurrence of a leak due to semiconductor residuals in the streets can be manufactured.

Figure 7:
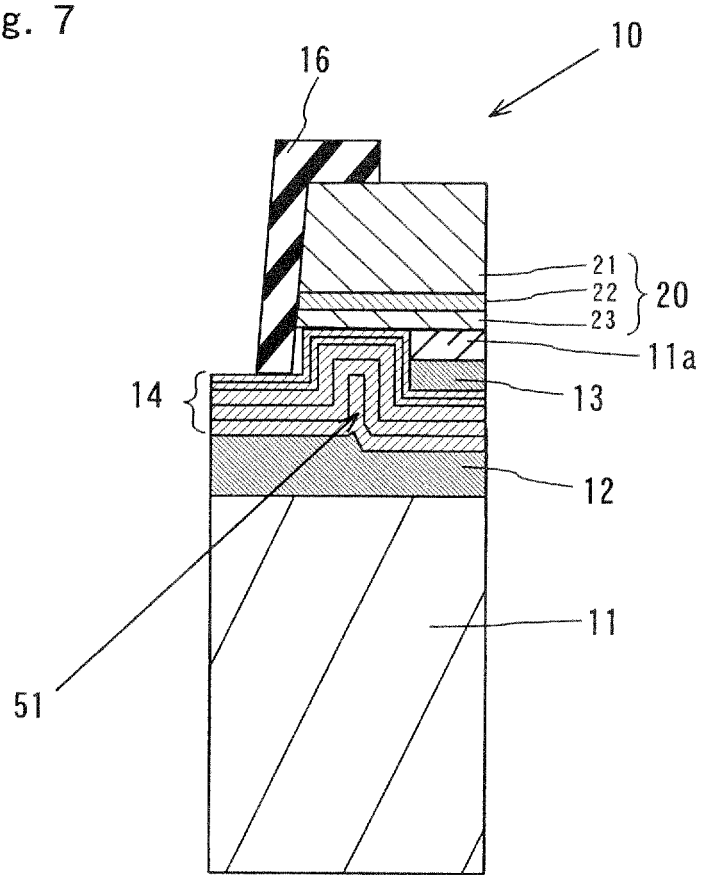
FIG. 7 is a schematic fragmentary cross-sectional view of the periphery of the semiconductor light emitting element obtained by the semiconductor light emitting element manufacturing method of the embodiment.
Figure 8A:
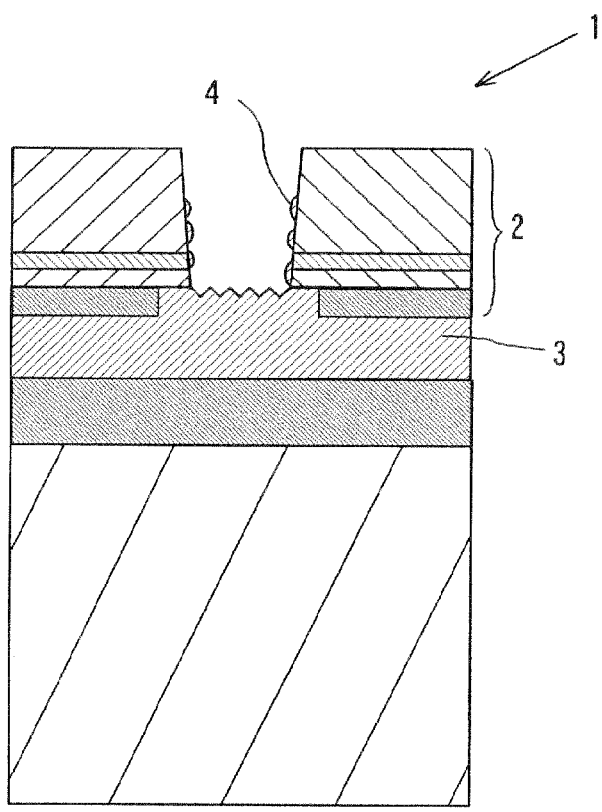
FIGS. 8A and 8B are schematic fragmentary cross-sectional views each showing a substrate for explaining problems in a conventional manufacturing method of a semiconductor light emitting element.
Figure 8B:
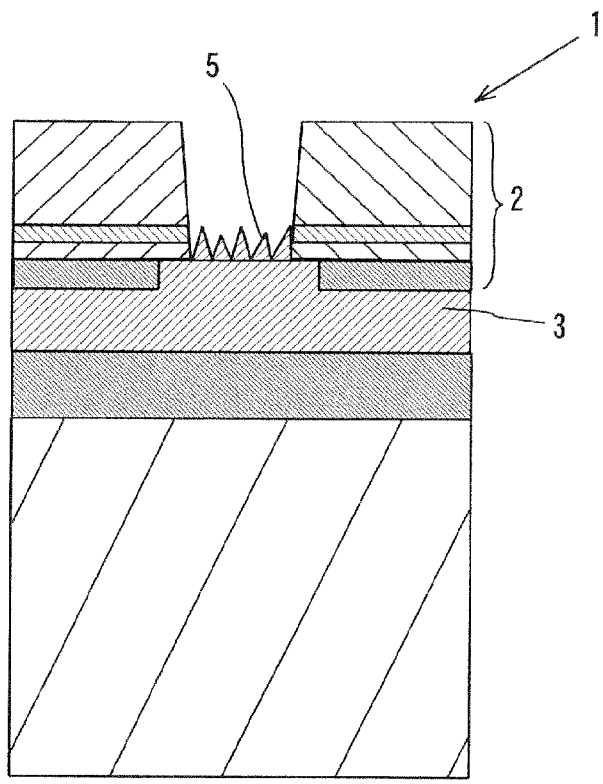

In the second etching step of the above manufacturing method, as shown in FIG. 7, a wave-like bend 51 where part of the multilayered cap layer is folded is formed in the periphery of the cap layer 14 around the edge of the p-electrode 13. The curved surface of the wave-like bend 51 that extends down to the p-type semiconductor layer 23 of the semiconductor laminated body 20 is caused by the cap layer spreading into the separation groove 44.

The wave-like bend 51 is formed if the width of the separation groove 44 is greater than twice the thickness of the first-formed layer of the multilayered film forming the cap layer, that is provided directly on the semiconductor laminated body 20 and the p-electrode 13. In the case of the above embodiment, the multilayered film where Ti of 100 nm thickness is first formed is formed to fill the separation groove 44 of a width greater than or equal to 1 μm, and hence the wave-like bend 51 is formed.

As such, the semiconductor light emitting element of the present embodiment has the wave-like bend 51 having a structure where part of the cap layer is bent like a wave around the periphery of the p-electrode 13 of the semiconductor laminated body 20. This wave-like bend 51 alleviates stress in plane directions in each layer, thus preventing the p-electrode of Ag and the cap layer from peeling off. The Ag of the p-electrode 13 covered up to the end face by the cap layer 14 efficiently reflects light emitted from the active layer 22, and the cap layer 14 can prevent the migration of the Ag.

Although in the present embodiment electrodes are provided at the top and bottom, a flip chip structure may be taken on. By making only parts of the n-type semiconductor layer 21 of the semiconductor laminated body 20 be exposed before the wafer bonding step and forming n-electrodes thereon to provide n-electrodes and p-electrodes separated and electrically insulated from each other on the support substrate side of the semiconductor laminated body 20 and then bonding together, flip chips can be manufactured.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed embodiments but may be practiced within the full scope of the appended claims.

This application is based upon and claims the benefit of priority from the prior Japanese Patent Application No. 2011-062099, filed on Mar. 22, 2011, the entire contents of which is incorporated herein by reference.

What is claimed is:

1. A semiconductor light emitting element, comprising:
   a semiconductor laminated body including an active layer;
   an electrode formed on said semiconductor laminated body to supply a current to said active layer, the electrode comprising a metal film;
   a cap layer formed over said semiconductor laminated body and said electrode, wherein said cap layer comprises a multilayered film consisting of a plurality of individual metal layers;
   a wave-like bend having a multilayer structure integrated with the multilayered film of said cap layer at an edge portion of said cap layer, wherein the multilayered structure is folded back on itself to form a folded protrusion, and wherein the folded protrusion surrounds an edge of the metal film of said electrode and contacts the semiconductor laminated body;
   a bonding layer formed over said cap layer and the multilayered structure; and
   a support substrate to support said semiconductor laminated body via said bonding layer.

\* \* \* \* \*